(12) United States Patent
Ishii et al.

(10) Patent No.: US 8,314,478 B2
(45) Date of Patent: Nov. 20, 2012

(54) SEMICONDUCTOR MEMORY DEVICE AND MANUFACTURING THE SAME

(75) Inventors: Hitoshi Ishii, Kanagawa (JP); Naohisa Okumura, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 35 days.

(21) Appl. No.: 13/051,582

(22) Filed: Mar. 18, 2011

(65) Prior Publication Data

US 2011/0233741 A1   Sep. 29, 2011

(30) Foreign Application Priority Data

Mar. 26, 2010  (JP) ................. 2010-072921

(51) Int. Cl.
  *H01L 23/495*   (2006.01)
  *H01L 21/00*   (2006.01)
(52) U.S. Cl. ...................... 257/666; 438/123
(58) Field of Classification Search .......... 257/666, 257/686, 787, 723, 724, 777; 438/107, 123, 438/110, 111, 112, 124, 127
See application file for complete search history.

(56) References Cited

U.S. PATENT DOCUMENTS

| | | | |
|---|---|---|---|
| 6,541,311 B1 * | 4/2003 | Hauser et al. ............... | 438/123 |
| 7,193,305 B1 | 3/2007 | Miks et al. | |
| 2007/0218588 A1 * | 9/2007 | Takiar et al. ............... | 438/109 |
| 2011/0198740 A1 * | 8/2011 | Matsushima ............... | 257/668 |
| 2011/0210432 A1 * | 9/2011 | Goto ............................ | 257/666 |
| 2011/0260312 A1 * | 10/2011 | Goto ............................ | 257/676 |
| 2011/0316134 A1 * | 12/2011 | Ishii et al. ................... | 257/676 |
| 2012/0049378 A1 * | 3/2012 | Asada et al. ............... | 257/773 |

FOREIGN PATENT DOCUMENTS

JP   2004-349396   12/2004

OTHER PUBLICATIONS

U.S. Appl. No. 13/168,292, filed Jun. 24, 2011, Ishii, et al.
U.S. Appl. No. 13/027,668, filed Feb. 15, 2011, Ryoji Matsushima.
U.S. Appl. No. 13/408,392, filed Feb. 29, 2012, Doi, et al.

* cited by examiner

*Primary Examiner* — S. V Clark
(74) *Attorney, Agent, or Firm* — Oblon, Spivak, McClelland, Maier & Neustadt, L.L.P.

(57) ABSTRACT

According to one embodiment, a semiconductor memory device including an organic substrate with an external connection terminal and a semiconductor memory chip. The semiconductor memory device further includes a lead frame having a bonded portion and an installation portion. It further includes a resin mold for sealing the semiconductor memory chip. The lead frame is provided with a plurality of extensions at least from one of the installation portion and the bonded portion, in a way of extending at least to two or more sides of the resin mold.

16 Claims, 12 Drawing Sheets

SEMICONDUCTOR MEMORY DEVICE AND MANUFACTURING THE SAME

CROSS-REFERENCE TO RELATED APPLICATIONS

This application is based upon and claims the benefit of priority from the prior Japanese Patent Application No. 2010-72921, filed on Mar. 26, 2010; the entire contents of which are incorporated herein by reference.

FIELD

Embodiment described herein relates generally to a semiconductor memory device and manufacturing the same.

BACKGROUND

As a memory device of electronic equipment such as a cell phone and a personal computer, a semiconductor memory device using a memory element such as a NAND-type flash memory has been often used these days. As the semiconductor memory device for use in the electronic equipment, a memory card (semiconductor memory card) can be taken as an example.

In the semiconductor memory device, semiconductor chips such as semiconductor memory chips and controller chips are mounted on a wiring substrate with external terminals formed thereon. Electrodes on the semiconductor chip are electrically connected to connection pads on a wiring substrate through wire bonding and further sealed by a resin to cover the whole semiconductor chips.

With a widespread use of this semiconductor memory device, cost reduction in manufacturing the semiconductor memory device is challenged. For example, a method for reducing the cost for manufacturing a semiconductor memory device is disclosed, in which an organic substrate formed by a comparatively expensive material is used for the wiring substrate, in an L-shape in a top view, in a way of restraining the use amount of the organic substrate.

However, an installation area of the semiconductor memory chips occupies a comparatively large area in the semiconductor memory device and formed of an organic substrate. Therefore, the cost reduction effect is restricted.

DETAILED DESCRIPTION

In general, according to one embodiment, a semiconductor memory device is provided, including an organic substrate with external connection terminals formed on one surface and semiconductor memory chips. The semiconductor memory device further includes a lead frame having a bonded portion to be bonded to the other surface of the organic substrate and an installation portion with the semiconductor memory chips installed there. Further, the semiconductor memory device includes a resin mold formed in a substantially rectangular shape in a top view, with the external connection terminals exposed, for sealing the organic substrate, the lead frame, and the semiconductor memory chips. The organic substrate is bonded to the bonded portion and individuated in a shape of not overlapping the installation portion in a top view. The lead frame has a plurality of extensions extending to at least two or more sides of the resin mold, from at least one of the installation portion and the bonded portion.

Exemplary embodiments of the semiconductor memory device and its manufacturing method will be explained below in detail with reference to the accompanying drawings. The present invention is not limited to the following embodiments.

Figure 1:
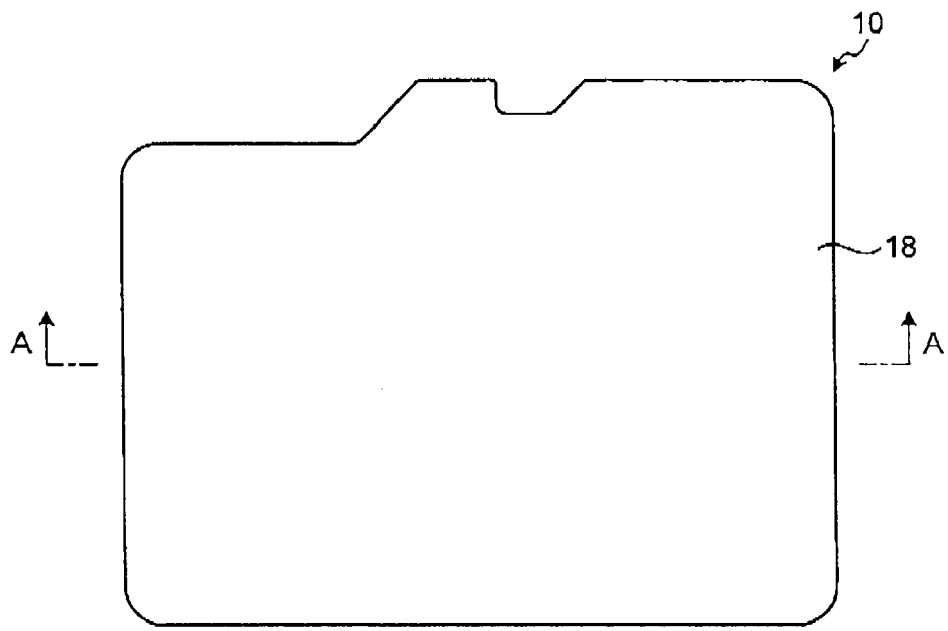
FIG. 1 is a top plan view illustrating an appearance of a semiconductor memory device according to the embodiment.
Figure 2:
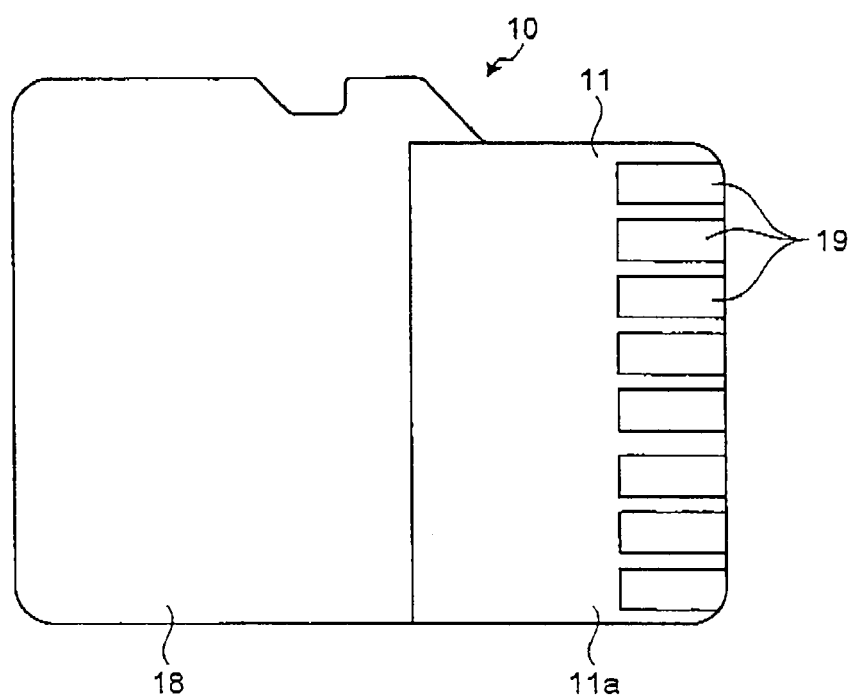
FIG. 2 is a bottom view illustrating the appearance of the semiconductor memory device illustrated in FIG. 1.
Figure 3:
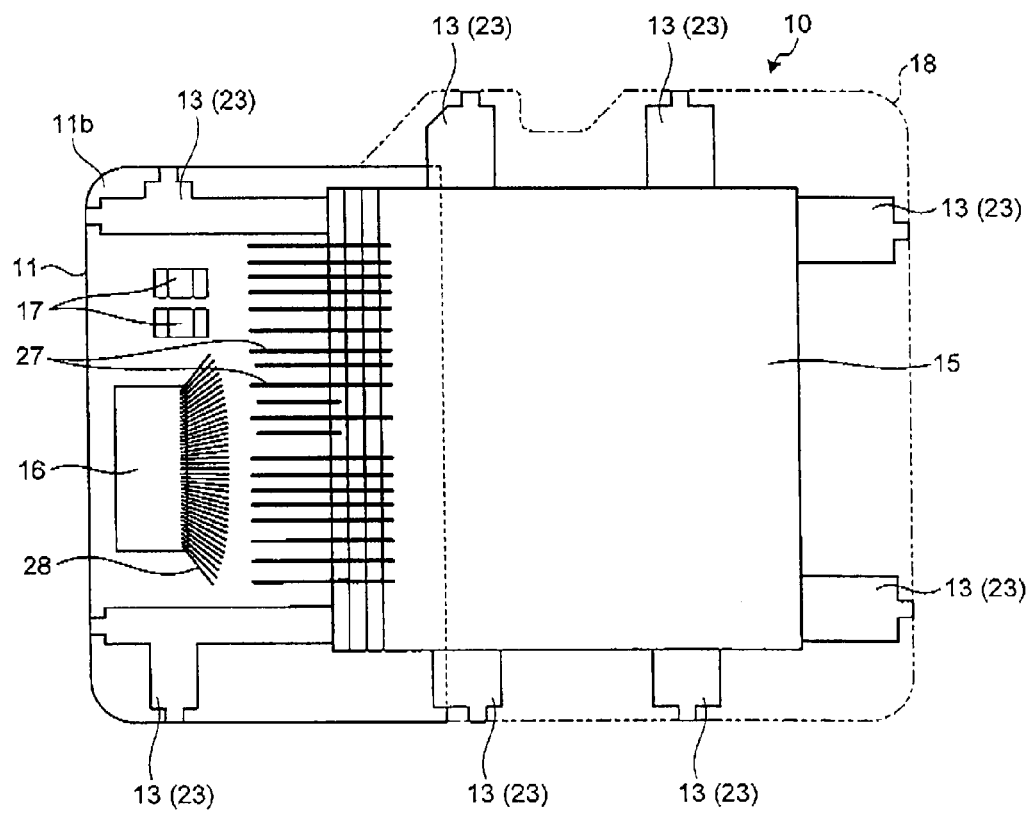
FIG. 3 is a view schematically illustrating the internal structure of the semiconductor memory device illustrated in FIG. 1.
Figure 4:
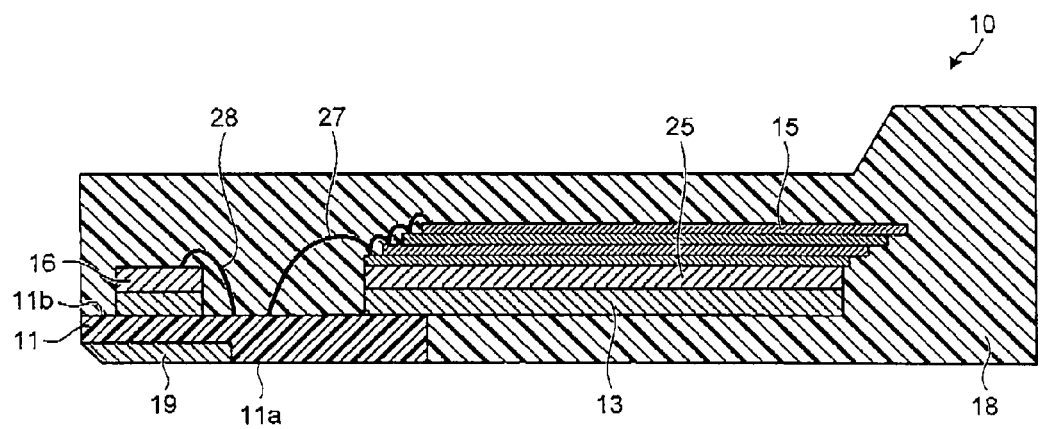
FIG. 4 is a transverse sectional view illustrating the cross sectional structure taken along the line A-A in the semiconductor memory device illustrated in FIG. 1.

FIG. 1 is a top plan view illustrating the appearance of the semiconductor memory device according to the first embodiment. FIG. 2 is a bottom view illustrating the appearance of the semiconductor memory device illustrated in FIG. 1. FIG. 3 is a view schematically illustrating the internal structure of the semiconductor memory device illustrated in FIG. 1. FIG. 4 is a transverse sectional view illustrating the cross sectional structure taken along the line A-A in the semiconductor memory device illustrated in FIG. 1. The semiconductor memory device 10 is, for example, a micro SD card (registered trademark).

The semiconductor memory device 10 includes an organic substrate 11, a lead frame 13, a semiconductor memory chip 15, a controller chip 16, an electric part 17, and a resin mold 18. As illustrated in FIGS. 1 and 2, the peripheral portion of the semiconductor memory device 10 is covered by the resin mold 18 with external connection terminals 19 exposed to the bottom surface. The semiconductor memory device 10 has a substantially rectangular shape in a top view, being covered by the resin mold 18.

The organic substrate 11 is provided with a wiring network in the inner portion and on the surface, for example, of the insulating resin substrate, working as an element mounted substrate and a terminal formed substrate. As the organic substrate 11, a printed wiring board made of glass-epoxy resin and BT resin (bismaleimide triazine resin) is used. Although the detailed illustration is omitted, the organic substrate 11 is formed in a multi-layer structure, on some occasions, with each layer made of different material.

Figure 5:
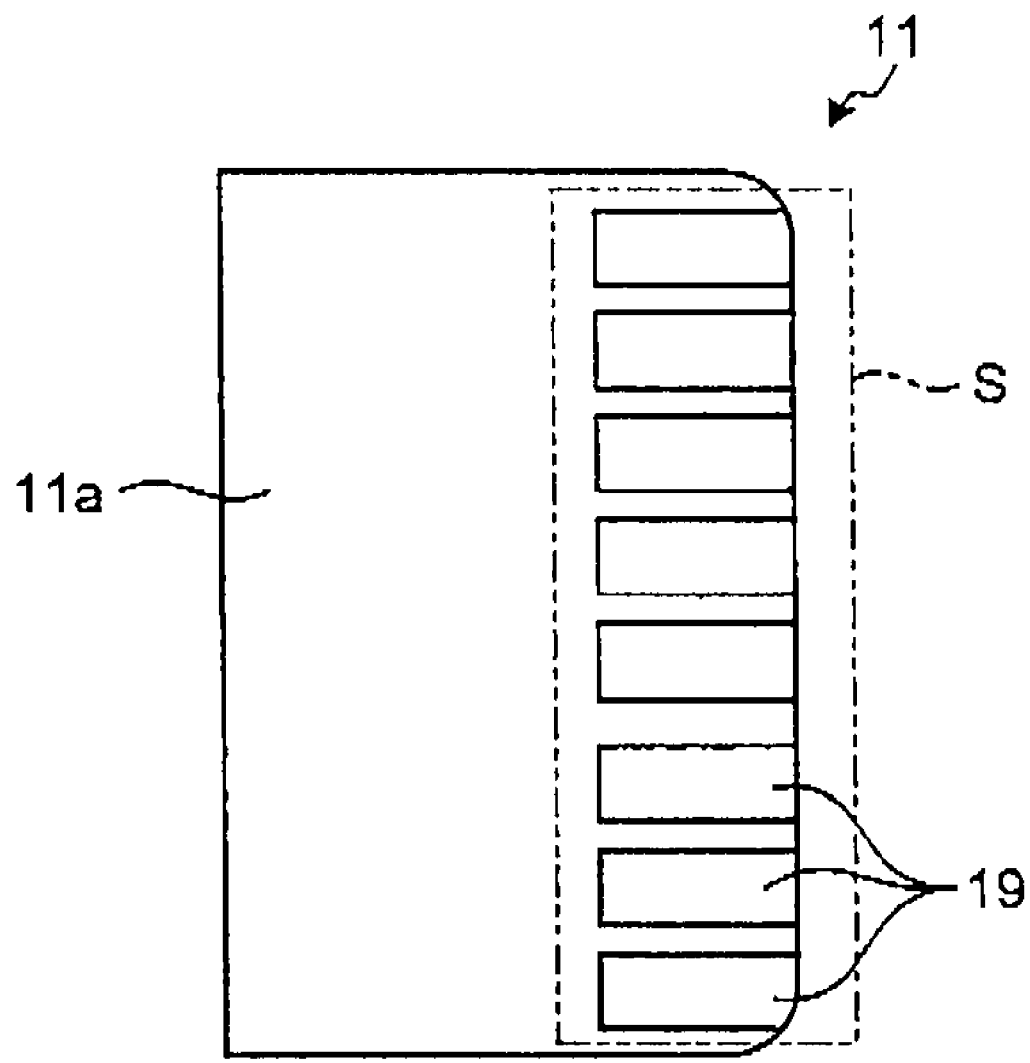
FIG. 5 is a bottom view of an organic substrate.

FIG. 5 is a bottom view of the organic substrate 11. The external connection terminals 19 including a metal layer are provided on the bottom surface (one surface) 11a of the organic substrate 11. The external connection terminals 19 become input and output terminals of the semiconductor memory device 10. In a top view of the internal structure of the semiconductor memory device 10, the organic substrate 11 is formed separately into most of a shape not to overlap a memory chip installation portion (installation portion) 21 of the lead frame 13 described later (refer to FIG. 9). In other words, in a top view, a non-overlapping portion of the organic substrate 11 and the installation portion 21 is larger than the overlapping portion of the organic substrate 11 and the installation portion 21.

A top surface 11b (the other surface) of the organic substrate 11 is a mounting surface configured to mount the controller chip 16 and the electric part 17. Therefore, the area of the top surface 11b of the organic substrate 11 is larger than the area of the controller chip 16 and the electric part 17 in a top view. The top surface 11b of the organic substrate 11 is provided with a plurality of connection pads (not illustrated). The connection pads and the external connection terminals 19, and the mutual connection pads are electrically connected via the internal wiring (e.g. through holes) of the organic substrate 11. By electrically connecting the electrode pads (not illustrated) of the semiconductor memory chips 15 and the controller chip 16 to the connection pads, the respective elements of the semiconductor memory chips 15, the controller chip 16, and the external connection terminals 19 are electrically connected.

Here, of the connection pads, those ones connected to the semiconductor memory chips 15 are arranged almost in parallel to the alignment direction of the external terminals. Of the connection pads, those ones connected to the controller chip 16 are arranged in the vicinity of the electrode pads of the controller chip 16. As the result, the electrode pads of the semiconductor memory chips 15 can be directly connected to the connection pads arranged on the top surface lib of the organic substrate 11 via metal wires 27. Further, the electrode pads of the controller chip 16 can be directly connected to the connection pads arranged on the top surface 11b of the organic substrate 11 via metal wires 28. By putting the connection pads connected to the semiconductor memory chips 15 and the connection pads connected to the controller chip 16 between the electrode pads of the semiconductor memory chips 15 and the electrode pads of the controller chip 16, a distance between the connection pads of the semiconductor memory chips 15 and the controller chip 16 can be shortened. As the result, the semiconductor memory chips 15 can be connected to the controller chip 16 with a low resistance. The arrangement of the connection pads of the organic substrate 11 is not restricted to the above-mentioned case. For example, when the controller chip 16 is rotated at 180° from the position illustrated in FIG. 3, the connection pads of the controller chip 16 are arranged to be sandwiched by the connection pad of the semiconductor memory chips 15.

Further, of the connection pads, the pitch of the connection pads electrically connected to the semiconductor memory chips 15 is substantially 80 to 150 μm, and the pitch of the connection pads electrically connected to the controller chip 16 is substantially 50 to 120 μm. In short, the intervals of the connection pads electrically connected to the controller chip 16 are smaller than the intervals of the connection pads electrically connected to the semiconductor memory chips 15.

Figure 6:
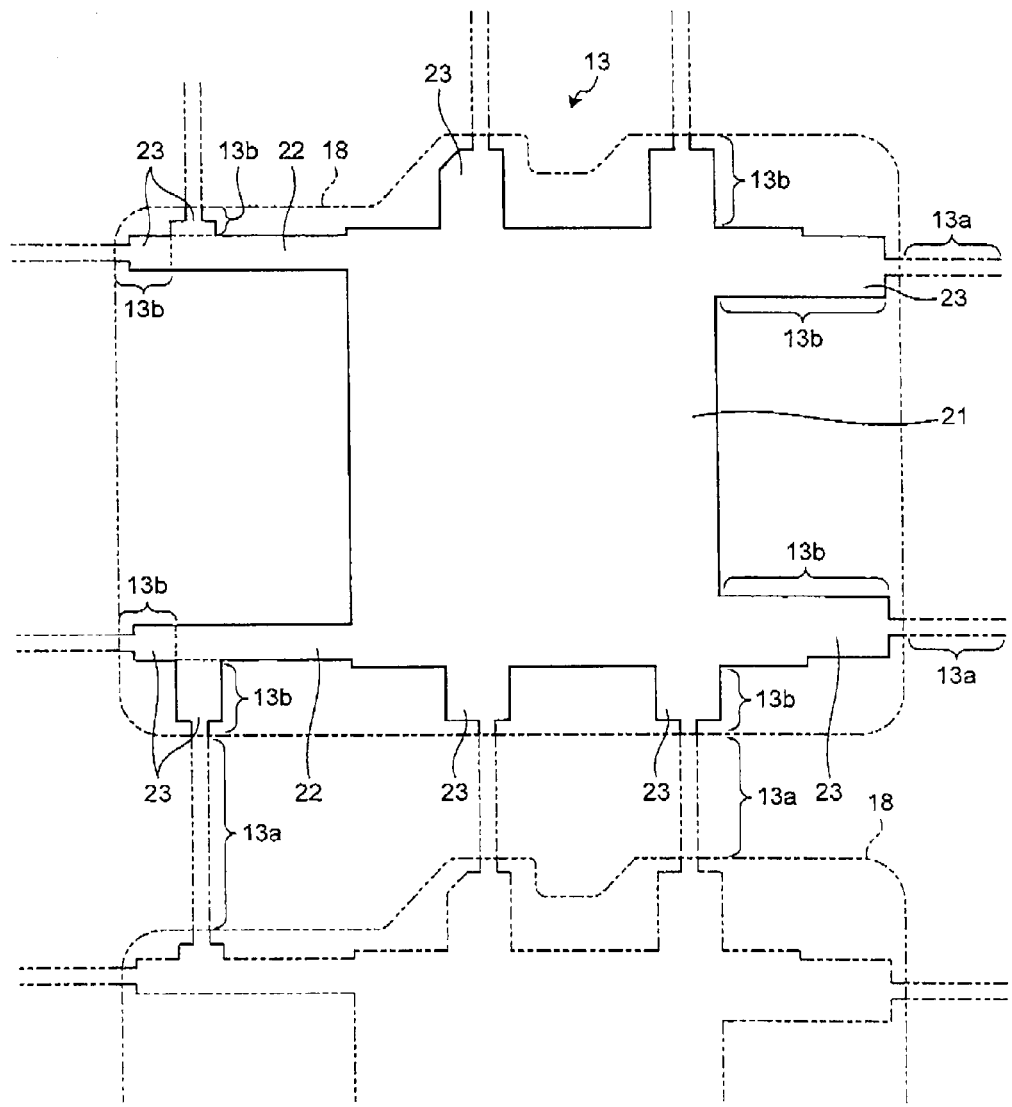
FIG. 6 is a top plan view of a lead frame.

FIG. 6 is a top plan view of the lead frame 13. The lead frame 13 is formed of a general material, for example, 42 Alloy or copper, more inexpensive than the material for use in the organic substrate 11. The lead frame 13 has the installation portion 21, a substrate bonded portion 22, and a joint portion 23.

The installation portion 21 is an area for installing the semiconductor memory chips 15. The substrate bonded portion 22 and the joint portion 23 are formed around the installation portion 21 in a way of extending from the installation portion 21. The substrate bonded portion 22 is an area to be bonded to the top surface 11b of the organic substrate 11 via adhesive. By bonding the substrate bonded portion 22 to the top surface 11b of the organic substrate 11, the installation portion 21 is located at a position where it hardly overlaps the organic substrate 11 in a top view.

Although most of the installation portion 21 does not overlap the organic substrate 11 so much in a top plan view, the installation portion 21 and the organic substrate 11 have a small overlapping portion. Also, in this overlapping portion, the installation portion 21 and the organic substrate 11 are bonded to each other. By bonding the installation portion 21 to the organic substrate 11, a adhesive area of the organic substrate 11 and the lead frame 13 gets larger. Therefore, compared with in the case of bonding the lead frame 13 to the organic substrate 11 only by the substrate bonded portion 22, adhesive power of the organic substrate 11 and the lead frame 13 can be reinforced. An adhesive can be used to bond the overlapping portion of the installation portion 21 and the organic substrate 11. As the result, adhesive power of the organic substrate 11 and the lead frame 13 can be further reinforced.

The joint portion 23 is formed from the installation portion 21 and the substrate bonded portion 22 in a way of extending to the periphery of the semiconductor memory device 10, namely, to the periphery of the resin mold 18 described later. As illustrated in FIG. 6, the lead frame 13 has a plurality of the joint portions 23. The joint portions 23 are to joint a plurality of lead frames 13 in the manufacturing steps of the semiconductor memory device. According to this, by jointing the lead frames 13, a lot of semiconductor memory devices 10 can be collectively manufactured. In FIG. 6, the outer shape of the semiconductor memory device is indicated by a dashed double-dotted line. In the embodiment, the joint portions 23 are formed to extend to the four sides of the substantially rectangular semiconductor memory device 10 in a top view.

At least, with respect to one of the four sides of the semiconductor memory device 10 in a top view, two or more joint portions 23 are designed to extend to the corresponding one side. In this embodiment, each side has two and more joint portions 23 extending to the corresponding side in all the four sides of the semiconductor memory device 10.

The joint portion 23 includes a surplus portion 13a and an extension 13b. The surplus portion 13a is a portion protruding from the semiconductor memory device 10 and in the end, cut off and removed. The extension 13b does not protrude from the final outer shape of the semiconductor memory device 10, but forms a part of the semiconductor memory device 10. The joint portion 23 is designed to get narrower in the boundary with the outside of the semiconductor memory device 10 than in the root of the installation portion 21 and the substrate bonded portion 22, in a top view. Especially, in the embodiment, it is designed to get narrower in the vicinity of the boundary with the outside of the semiconductor memory device 10.

The semiconductor memory chip 15 is a memory element such as a NAND-type flash memory. The semiconductor memory chip 15 includes a plurality of electrode pads in one side. The pitch of the electrode pads of the semiconductor memory chip 15 is substantially 80 μm or more, and of the connection pads of the organic substrate 11, the pitch of the connection pads electrically connected to the semiconductor memory chip 15 is formed at substantially 80 to 150 µm, according to the semiconductor memory chip. The semiconductor memory chips 15 are stacked on the installation portion 21. Of the semiconductor memory chips 15, the semiconductor memory chip 15 in the lowest layer is bonded to the installation portion 21 via an adhesive material 25. As the adhesive material 25, for example, a thermosetting or photo curing die attach film (adhesive film) mainly formed of general polyimide resin, epoxy resin, and acrylate resin, or liquid material is used.

By bonding the other semiconductor memory chips 15 in a stepped way to the semiconductor memory chip 15 in the lowest layer bonded to the installation portion 21, the plurality of the semiconductor memory chips 15 are stacked. By stacking the semiconductor memory chips 15 like a staircase, the electrode pads provided on the respective one sides of the semiconductor memory chips 15 can be exposed. Further, the respective sides with the electrode pads of the respective semiconductor memory chips 15 are stacked so as to face the organic substrate 11. The exposed electrode pads are electrically bonded to the connection pads of the organic substrate 11 via the metal wires 27 such as Au wires (wire bonding).

The controller chip 16 is installed on the top surface lib of the organic substrate 11. The controller chip 16 selects a semiconductor memory chip 15 where data is written and read, from the plurality of the semiconductor memory chips 15. The controller chip 16 writes and reads data into and from the selected semiconductor memory chip 15. Electrode pads (not illustrated) are formed on the top surface of the controller chip 16. The electrode pads on the controller chip 16 are arranged around the controller chip 16. The number of the electrode pads belonging to the controller chip 16 is larger than the number of the electrode pads belonging to the semiconductor memory chips 15. The pitch of the electrode pads belonging to the controller chip 16 is substantially 30 to 100 µm, narrower than the intervals of the connection pads electrically connected to the controller chip 16, of the plurality of the connection pads of the organic substrate 11. The electrode pads of the controller chip 16 and the connection pads of the organic substrate 11 are wire-bonded via the metal wires 28.

The electric part 17 is installed on the top surface lib of the organic substrate 11. The electric part 17 includes, for example, a chip condenser, a resistance, and an inductor. The electric part 17 is mounted on the organic substrate 11 and electrically connected to the semiconductor memory chip 15 and the controller chip 16, not via the metal wire but via the internal wiring of the organic substrate. As the result, parasitic capacitance and parasitic resistance of the semiconductor memory device 10 can be reduced.

The resin mold 18 is formed by sealing the top surface 11b of the organic substrate 11 and the both surfaces of the lead frame 13 with a resin material. The top surface 11b of the organic substrate 11 is sealed with the resin material, while the external connection terminals 19 are exposed to the outside. The resin mold 18 forms the outer envelope of the semiconductor memory device 10. The resin mold 18 is formed thick enough to cover the semiconductor memory chips 15 and the controller chip 16. The resin mold 18 is formed by covering the organic substrate 11 and the lead frame 13 having the installation components such as the semiconductor memory chips 15 installed thereon with a metal mold and by injecting the jellified resin material into the metal mold.

Figure 7:
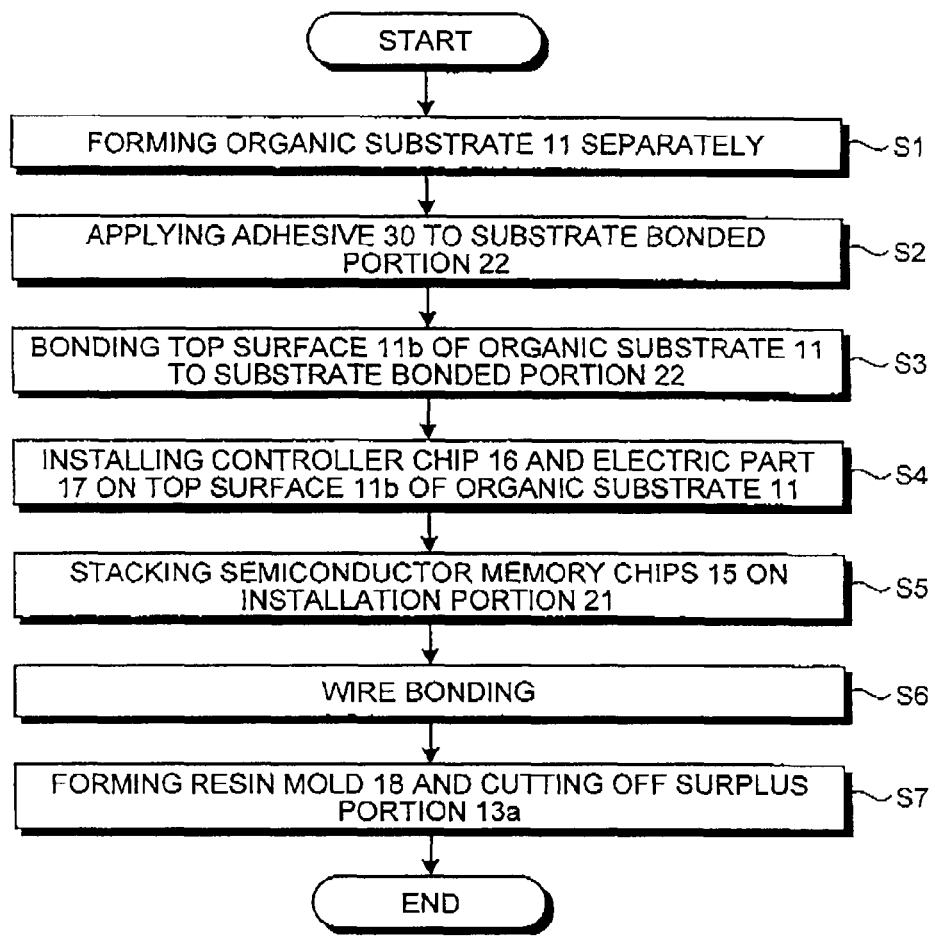
FIG. 7 is a flow chart for use in describing a process of manufacturing the semiconductor memory device.
Figure 8:
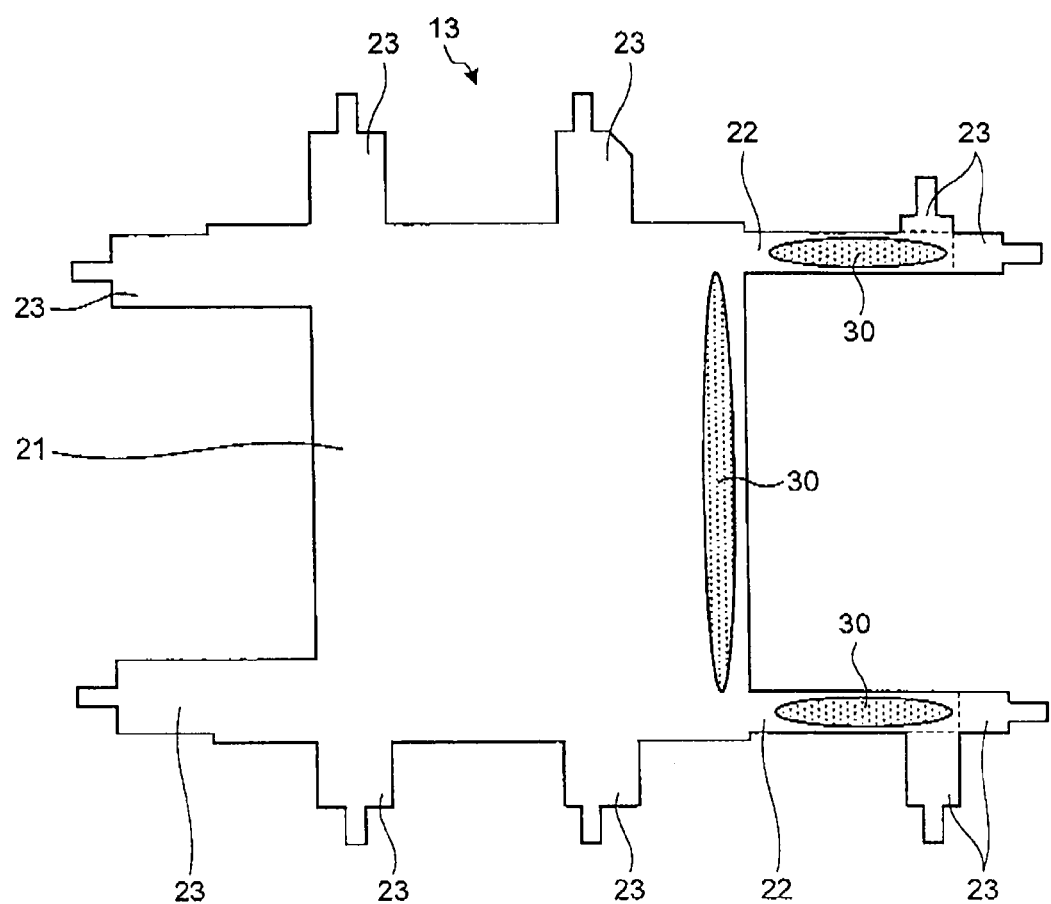
FIG. 8 is a view for use in describing the process of manufacturing the semiconductor memory device.

Next, a method of manufacturing the semiconductor memory device 10 will be described. FIG. 7 is a flow chart for use in describing the manufacturing process of the semiconductor memory device 10. FIGS. 8 to 13 are views for use in describing the manufacturing process of the semiconductor memory device 10.

At first, the organic substrate 11 is formed separately (step S1). Since the organic substrate 11 is separately formed through the general process using, for example, a dicing blade (not illustrated), the detailed explanation is omitted. Next, an adhesive 30 is applied to the substrate bonded portion 22 of the lead frame 13 (refer to Step S2 and FIG. 8). As the adhesive 30, for example, a thermosetting or photo curing die attach film (adhesive film) mainly formed of general polyimide resin, epoxy resin, and acrylate resin, or liquid material is used. The adhesive 30 is applied also to an overlapping portion of the installation portion 21 and the organic substrate 11. Alternatively, the adhesive 30 applied to the overlapping portion of the installation portion 21 and the organic substrate 11 can be omitted.

Figure 9:
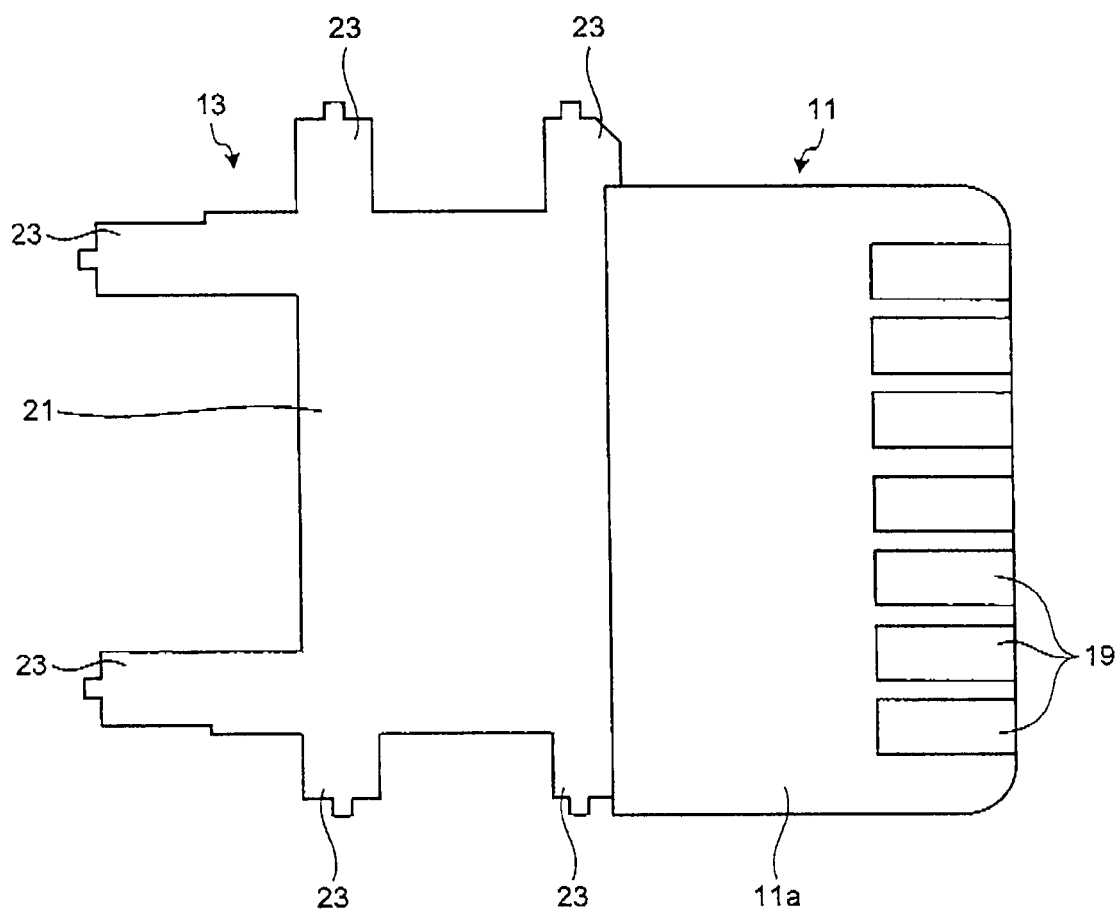
FIG. 9 is a view for use in describing the process of manufacturing the semiconductor memory device.
Figure 10:
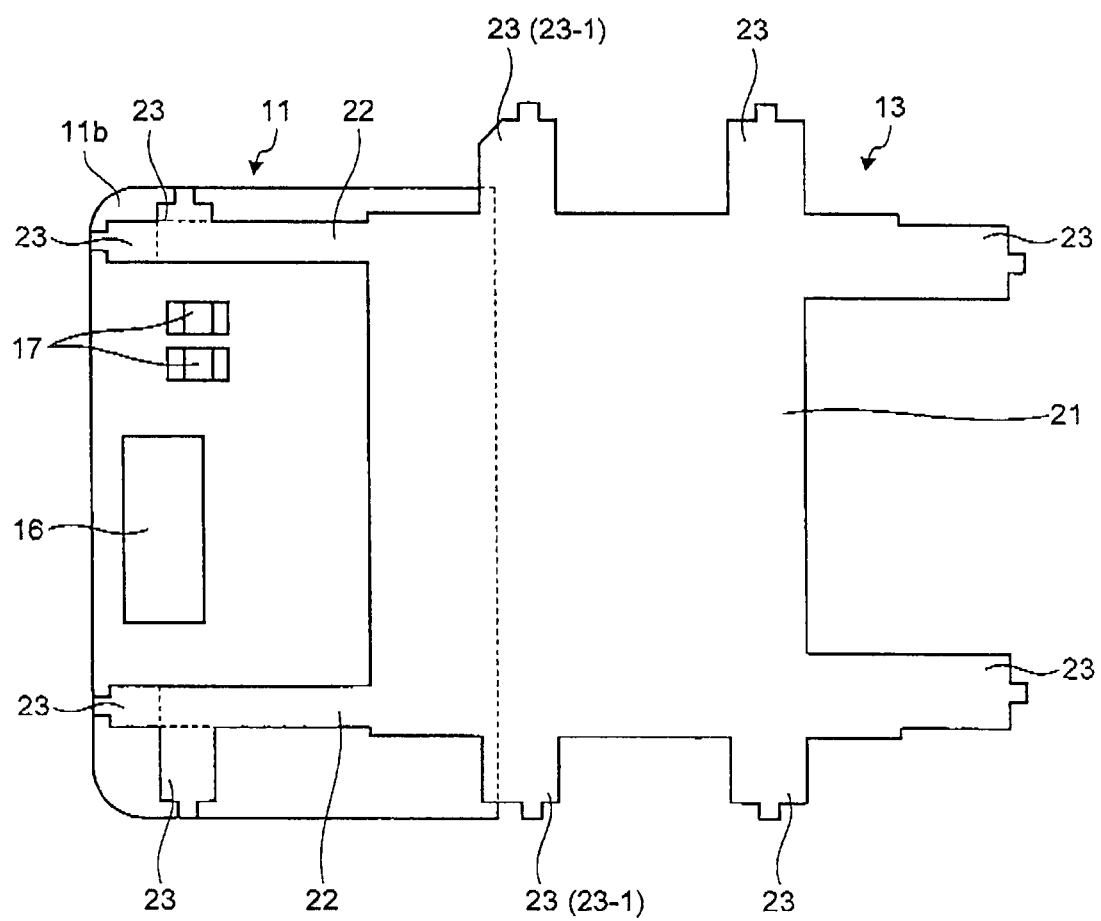
FIG. 10 is a view for use in describing the process of manufacturing the semiconductor memory device.
Figure 11:
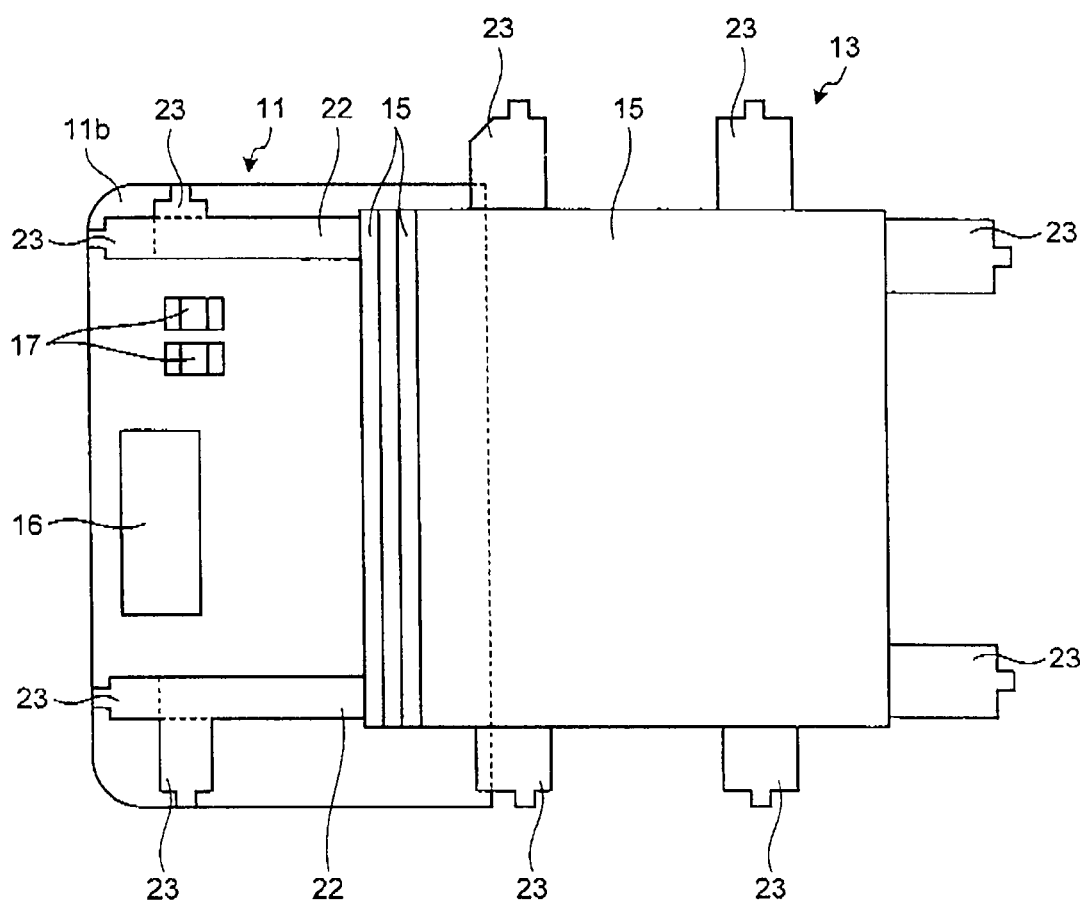
FIG. 11 is a view for use in describing the process of manufacturing the semiconductor memory device.

Next, the top surface 11b of the organic substrate 11 is bonded to the substrate bonded portion 22 with the adhesive 30 applied there (refer to Step S3 and FIG. 9). Next, the controller chip 16 and the electric part 17 are mounted on the top surface 11b of the organic substrate 11 (refer to Step S4 and FIG. 10). Next, the semiconductor memory chip 15 is bonded to the installation portion 21 through an adhesive material 25, and the semiconductor memory chip 15 is further bonded thereon, in a way of stacking the semiconductor memory chips 15 (refer to Step S5 and FIG. 11).

Figure 12:
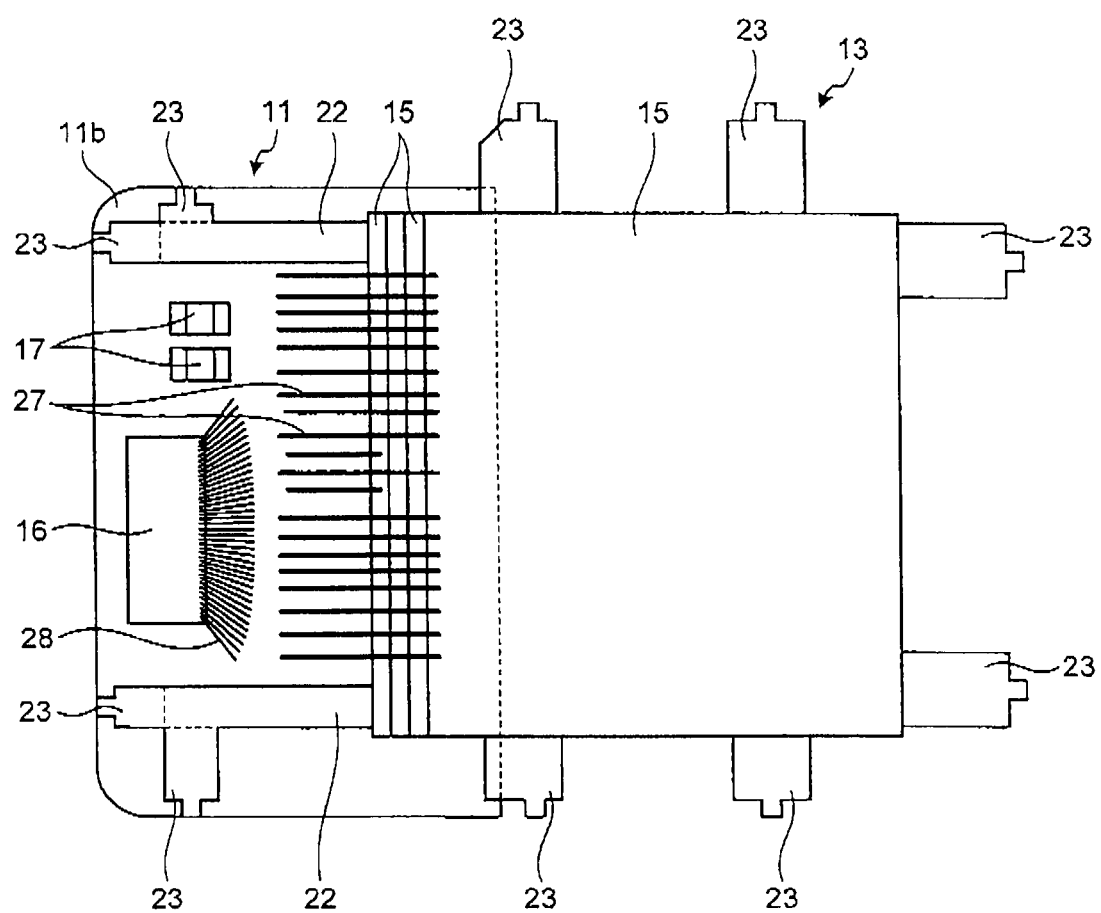
FIG. 12 is a view for use in describing the process of manufacturing the semiconductor memory device.
Figure 13:
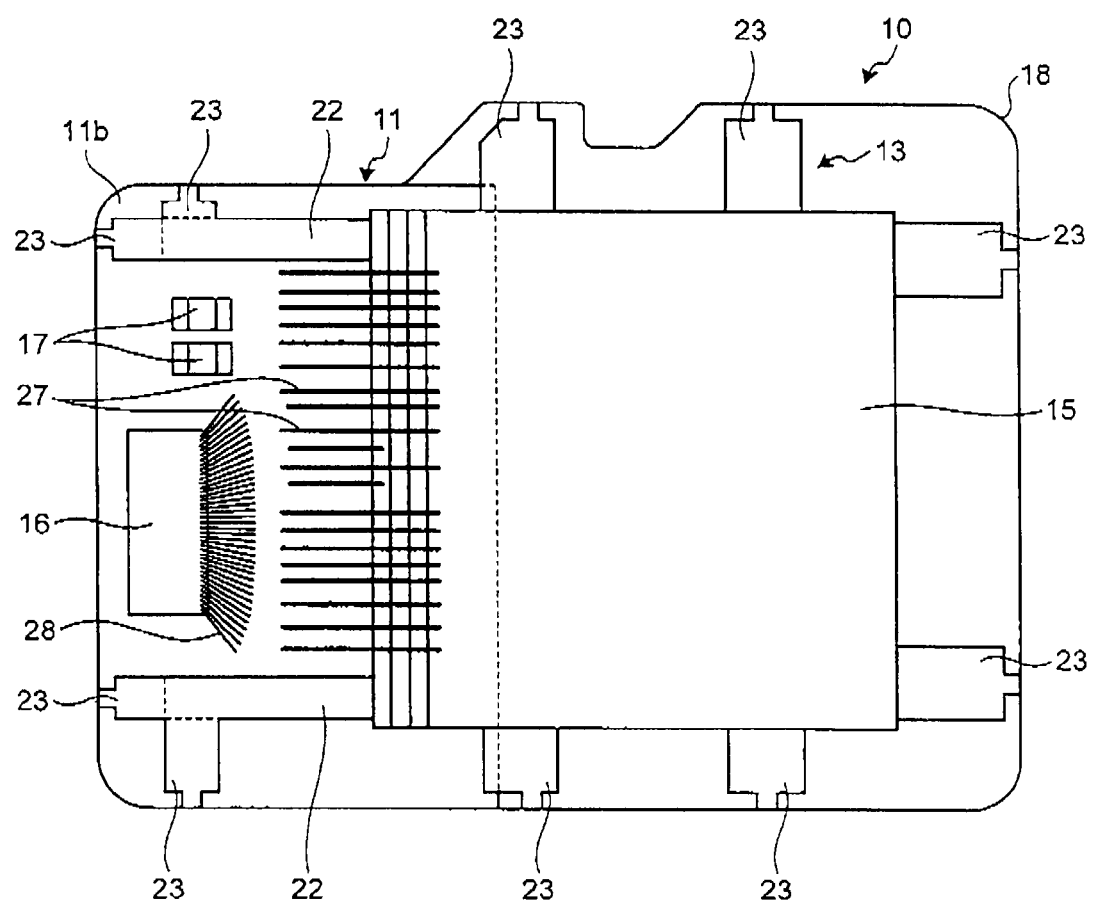
FIG. 13 is a view for use in describing the process of manufacturing the semiconductor memory device.

Then, the electrode pads of the semiconductor memory chips 15 are wire-bonded to the connection pads of the organic substrate 11 via the metal wires 27, and the electrode pads of the controller chip 16 are wire-bonded to the connection pads of the organic substrate 11 via the metal wires 28 (refer to Step S6 and FIG. 12). The top surface 11b of the organic substrate 11 and the both surfaces of the lead frame 13 are sealed with the resin material, to form the resin mold 18, and the surplus portion 13a is cut off (refer to Step S7 and FIG. 13). In FIG. 13, the internal structure (the semiconductor memory chip 15 and the like) which is covered with the resin mold 18 and not actually viewed is illustrated for the sake of convenience of description. According to the above series of processes, the semiconductor memory device 10 is manufactured.

Figure 14:
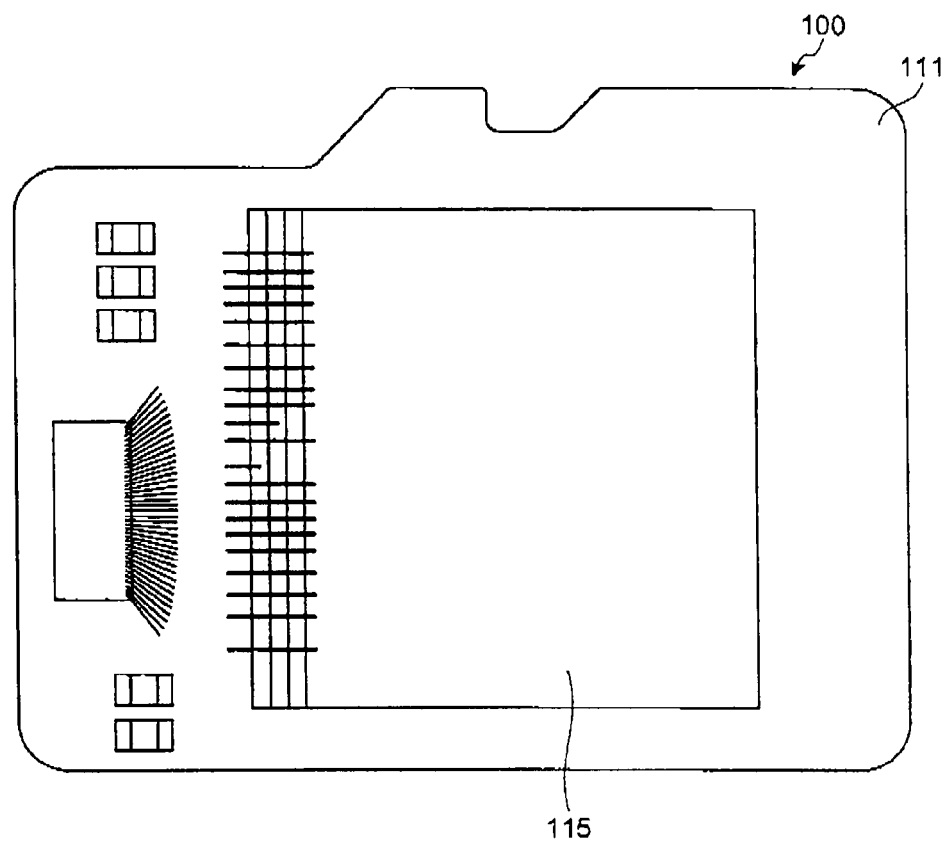
FIG. 14 is a view schematically illustrating the internal structure of a conventional semiconductor memory device.
Figure 15:
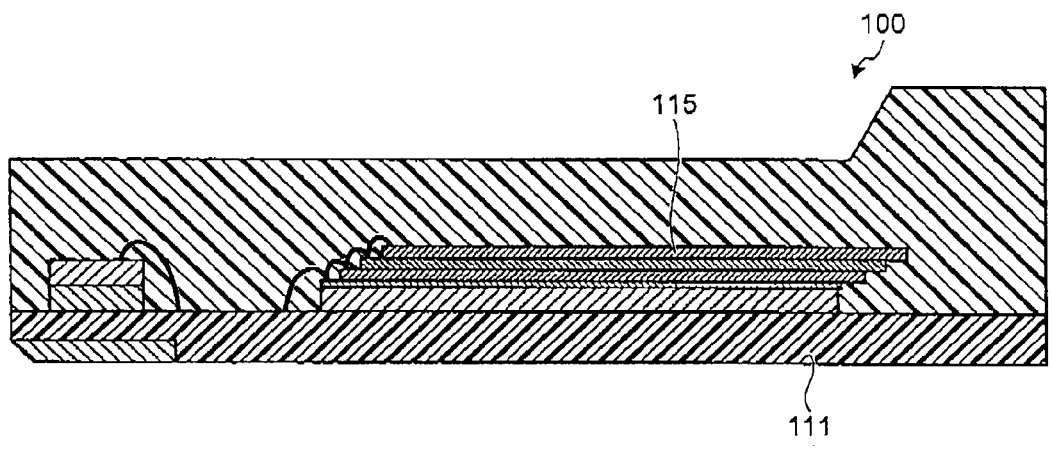
FIG. 15 is a transverse sectional view illustrating the cross sectional structure of the semiconductor memory device illustrated in FIG. 14.

FIG. 14 is a view schematically illustrating the internal structure of a semiconductor memory device 100 as a comparison example. FIG. 15 is a transverse sectional view illustrating the cross sectional structure of the semiconductor memory device 100 illustrated in FIG. 14. As sown in FIGS. 14 and 15, in the semiconductor memory device 100 of the comparison example, the semiconductor memory chips 115 are stacked on the organic substrate 111. Therefore, the organic substrate 111 is formed in a size enough to accommodate an area for installing the semiconductor memory chips 115.

On the other hand, in the semiconductor memory device 10 according to the embodiment, most of the organic substrate 11 is formed separately in a shape not to overlap the installation portion 21 in a top view of the internal structure of the semiconductor memory device 10, and therefore, the organic substrate 11 becomes compact and the use amount of the organic substrate 11 can be reduced extremely, compared with in the comparison example. This helps to reduce the manufacturing cost of the semiconductor memory device 10. Further, the organic substrate 11 may be formed separately in a substantially rectangular shape similar to the shape of the area S where the external connection terminals 19 are mounted (refer to FIG. 5), hence to make the organic substrate 11 further compact.

Further, the plurality of the joint portions 23 are formed on each of the four sides of the semiconductor memory device 10 having a substantially rectangular shape in a top view, extending to the respective four sides. Namely, the joint portions 23 extend from the lead frame 13 to the four directions. In the process of forming the resin mold 18, the joint portions 23 extending to the four directions are held tight by the metal mold, hence to support the lead frame 13. Because of the joint portions 23 extending in the four directions, the holding power of the lead frame 13 by the metal mold can be enhanced.

Especially, the installation portion 21 can be kept at a proper position within the metal mold. Although in injecting the resin material into the metal mold, the injection pressure may move the lead frame 13 and the semiconductor memory chip 15 may be out of the resin mold 18, the above structure can resolve this problem and enhance the yield. The joint portions 23 may not extend to all the four sides of the semiconductor memory device 10 in a top view but the joint portions 23 may extend at least to two or more sides of the semiconductor memory device 10 in a top view.

With respect to at least one of the four sides of the semiconductor memory device 10 in a top view, two or more joint portions 23 are designed to extend to the corresponding side, thereby enhancing the holding power of the lead frame 13 by the above mentioned mold.

The joint portion 23 is formed to extend also from the substrate bonded portion 22. Therefore, according to the same reason as mentioned above, the holding power of the substrate bonded portion 22 by the metal mold is enhanced in the process of forming the resin mold 18. In the semiconductor memory device 10, the bottom surface 11a of the organic substrate 11 is exposed. Therefore, in the process of forming the resin mold 18, by making the bottom surface 11a of the organic substrate 11 into close contact with the metal mold, the resin need to be prevented from intruding into the space between the bottom surface 11a and the metal mold.

For example, when the lead frame 13, especially, the substrate bonded portion 22 is deformed in a direction of deviating the organic substrate 11 from the metal mold, there occurs a space between the bottom surface 11a of the organic substrate 11 and the metal mold, into which a resin is easy to intrude. When the external connection terminals 19 are covered by the resin (flash) intruding into the space between the bottom surface 11a and the metal mold, there may occur a loose connection with the external equipment and a troublesome work of removing a flash. In the embodiment, however, since the joint portions 23 (extensions 13b) extending from the substrate bonded portion 22 can enhance the holding power of the substrate bonded portion 22 by the metal mold, deformation of the lead frame 13, especially the deformation of the substrate bonded portion 22 can be restrained, thereby assuredly adhering the organic substrate 11 to the metal mold. According to this, it is possible to avoid the resin from intruding into the space between the bottom surface 11a of the substrate 11 and the metal mold, to enhance the yield and reduce the manufacturing cost. The two joint portions 23 (extensions 13b) extend to the two sides of the resin mold from the substrate bonded portion 22. As the result, it is effective at avoiding the resin from intruding into the space between the bottom surface 11a of the substrate 11 and the metal mold.

Further, since the joint portion 23 is formed to get narrower in the boundary portion with the outside of the semiconductor memory device 10 than in the root of the installation portion 21 and the substrate bonded portion 22 in a top view, the area of the joint portions 23 to be cut can be reduced when cutting off the surplus portions 13a. Accordingly, it is possible to restrain the worn-out of a tool for cutting the joint portions 23, to lengthen the lifespan of the tool. The root of the joint portion 23 gets wider than the joint portion in the boundary with the outside of the semiconductor memory device 10, thereby avoiding a deterioration in the strength of the joint portions 23. According to this, it is possible to restrain a decrease in the holding power of the lead frame 13 by the metal mold.

By making the lead frame 13 into contact with the organic substrate 11, the relative positional relation between the organic substrate 11 and the installation portion 21 is determined. Further, by making the lead frame 13 into contact with the organic substrate 11, the positional deviation between the semiconductor memory chips 15 and the organic substrate 11 gets less, which avoids a deterioration in the yield while restraining a loose connection in the wire bonding process. Since the organic substrate 11 and the lead frame 13 are sealed by the resin mold 18 finally, a rigid bonding of the organic substrate 11 and the lead frame 13 is not required but just their bonding has only to be maintained up to the process of forming the resin mold 18. Namely, with the adhesive 30 applied to the installation portion 21 and the substrate bonded portion 22, the adhesive 30 applied to the overlapping portion of the installation portion 21 and the organic substrate 11 can be omitted. For example, when the overlapping portion of the installation portion 21 and the organic substrate 11 is small, the adhesive 30 can be avoided from protruding from the overlapping portion of the installation portion 21 and the organic substrate 11.

Further, the joint portions 23-1 extending to the outside of the resin mold 18 from the overlapping portion of the installation portion 21 and the organic substrate 11, which are positioned almost in the middle of the lead frame 13, overlap the organic substrate 11. As the result, a contact area of the lead frame 13 and the organic substrate 11 can be increased. Therefore, a deviation of the semiconductor memory chip 15 and the organic substrate 11 is reduced, hence to avoid a deterioration in the yield while reducing the loose connection in the wire bonding process.

Compared with the semiconductor memory chip 15, the controller chip 16 is easily increased in the number of the electrode pads to be formed there. Further, the controller chip 16 is easily formed into a smaller shape in a top plan view, compared with the semiconductor memory chip 15. Therefore, the electrode pads and the connection pads for wire-bonding the controller chip 16 are formed more densely than the electrode pads and the connection pads for wire-bonding the semiconductor memory chips 15. In the embodiment, since the controller chip 16 is installed not on the lead frame 13 but on the organic substrate 11, wire-bonding can be assuredly performed even in a state of the densely formed electrode pads and connection pads. On the other hand, the intervals of the electrode pads and the connection pads for wire-bonding of the semiconductor memory chips 15 are comparatively wide. Therefore, the wire-bonding of the semiconductor memory chips 15 is comparatively easier and by installing the semiconductor memory chips 15 on the lead frame 13, their wire-bonding can be performed even when they are distant from each other.

Since the controller chip 16 and the electric part 17 are mounted on the top surface 11b of the organic substrate 11, the bottom surface 11a of the organic substrate 11, namely the surface on the side of the external connection terminals 19 can be substantially flattened. This contributes to the downsizing of the semiconductor memory device 10. By reducing the unevenness on the periphery of the semiconductor memory device 10, smooth insertion and extraction of the semiconductor memory device 10 into and from the electric equipment can be realized.

The external connection terminals, the semiconductor memory chips 15, the controller chip 16, and the electric part 17 are connected through the internal wiring of the organic substrate 11. Namely, the semiconductor memory chips 15, the controller chip 16, and the electric part 17 are electrically connected not through a lead component. According to this, although the cut off portions of the surplus portions 13a are exposed to the outside of the resin mold 18, a troublesome work of insulating processing on these portions can be saved, hence to reduce the manufacturing cost of the semiconductor memory device 10 furthermore.

Downsizing of the organic substrate 11 in a top plane shape can restrain the deformation of the organic substrate 11 caused by the heat added there in the installation process of the electric part 17. As mentioned above, since the organic substrate 11 is formed in a multi-layer structure, and a material used in each layer is different in some cases. Since a material different in each layer has each different linear expansion coefficient, deformation by the heat history is easy to occur. Here, by downsizing the organic substrate 11 in a top plane shape, the occupation ratio of the organic substrate 11 in the whole semiconductor memory device 10 is reduced, thereby making it difficult to generate a deformation on the whole semiconductor memory device 10.

The relative positional relation between the installation portion 21 and the organic substrate 11 is not determined restrictedly in the case of determining it by the attachment of the lead frame 13. For example, the organic substrate 11 and the lead frame 13 may be separately fixed by the metal mold for forming the resin mold 18. By fixing the organic substrate 11 and the lead frame 13 to the metal mold, the mutual relative positional relation is determined.

Although the embodiment has been described by way of example of stacking a plurality of semiconductor memory chips 15 on the installation portion 21, it is not restricted to this but only one semiconductor memory chip 15 may be bonded to the installation portion 21, hence to form the semiconductor memory device 10.

The manufacturing process of the semiconductor memory device 10 is not restricted to the case illustrated by the flow chart of FIG. 7. For example, before the organic substrate 11 is bonded to the lead frame 13, the controller chip 16 and the electric part may be installed on the organic substrate 11. Further, before the organic substrate 11 is formed separately, the controller chip 16 and the electric part may be installed on the organic substrate 11.

Although in the embodiment, the semiconductor memory device 10 has been described taking a micro SD card as an example, it is not restricted to this but the embodiment can be applied to various kinds of memory devices having the semiconductor memory chip.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
    an organic substrate with an external connection terminal formed on one surface;
    a lead frame including a bonded portion to be bonded to the other surface of the organic substrate and an installation portion;
    a semiconductor memory chip mounted on the installation portion; and
    a resin mold having a substantially rectangular shape in a top view, configure to seal the organic substrate, the lead frame, and the semiconductor memory chip, with the external connection terminal exposed outwardly, wherein
    the organic substrate is formed separately into such a shape that in a top view, a non-overlapping portion of the organic substrate and the installation portion is larger than an overlapping portion of the organic substrate and the installation portion, when the organic substrate is bonded to the bonded portion, and
    the lead frame has a plurality of extensions extending at least to two or more sides of the resin mold, at least from one of the installation portion and the bonded portion.

2. The semiconductor memory device according to claim 1, wherein
    the extension is formed to get narrower in a top view in a boundary with the outside of the resin mold than in a root of the installation portion or the bonded portion.

3. The semiconductor memory device according to claim 1, wherein
    the lead frame has the extensions formed in a way of extending at least to one side of the resin mold.

4. The semiconductor memory device according to claim 1, wherein
    a part of the organic substrate and a part of the extensions overlap each other in a top view.

5. The semiconductor memory device according to claim 1, wherein
    the two extensions extend to two sides of the resin mold from the bonded portion.

6. The semiconductor memory device according to claim 1, further comprising
    a controller chip mounted on the other surface of the organic substrate.

7. The semiconductor memory device according to claim 6, wherein
    internal wiring is formed in the organic substrate, and
    the internal wiring is bonded to the semiconductor memory chip through a bonding wire, the internal wiring is bonded to the controller chip through a bonding wire, and
    the controller chip is electrically connected to the semiconductor memory chip through the internal wiring.

8. The semiconductor memory device according to claim 7, wherein
    the internal wiring is formed in the organic substrate, and
    the controller chip is electrically connected to the external connection terminal through the internal wiring.

9. The semiconductor memory device according to claim 1, further comprising
    an electric part mounted on the other surface of the organic substrate.

10. The semiconductor memory device according to claim 1, wherein the semiconductor memory chip is a NAND-type flash memory.

11. A manufacturing method of a semiconductor memory device, comprising the following processes of:
separately forming an organic substrate with an external connection terminal formed on one surface thereof, into such a shape that in a top view, a non-overlapping portion of the organic substrate and an installation portion which is formed on a lead frame to mount a semiconductor memory chip on is larger than an overlapping portion of the organic substrate and the installation portion,
bonding a bonded portion extending from the installation portion, which is formed on the lead frame, to the other surface of the organic substrate,
forming a resin mold which seals the organic substrate, the lead frame, and the semiconductor memory chip, with the external connection terminal exposed outward, and
forming a plurality of extensions in the lead frame in a way of extending at least to two or more sides of the resin mold, at least from one of the installation portion and the bonded portion.

12. The manufacturing method of the semiconductor memory device according to claim 11, comprising
a process of installing a controller chip on the other surface of the organic substrate.

13. The manufacturing method of the semiconductor memory device according to claim 12, comprising the following processes of
forming internal wiring in the organic substrate; and
bonding the internal wiring to the controller chip through a bonding wire, bonding the internal wiring to the semiconductor memory chip through a bonding wire, and electrically connecting the controller chip to the semiconductor memory chip through the internal wiring.

14. The manufacturing method of the semiconductor memory device according to claim 13, comprising the following processes of:
forming the internal wiring electrically connected to the external connection terminal in the organic substrate, and
connecting the controller chip to the internal wiring through a bonding wire and electrically connecting the external connection terminal through the internal wiring.

15. The manufacturing method of the semiconductor memory device according to claim 11, comprising
a process of installing an electric part on the other surface of the organic substrate.

16. The manufacturing method of the semiconductor memory device according to claim 11, wherein
the semiconductor memory chip is a NAND-type flash memory.

* * * * *